(12) United States Patent
Gauthier

(10) Patent No.: US 8,750,431 B2
(45) Date of Patent: Jun. 10, 2014

(54) LOGARITHMIC DETECTOR AND METHOD OF PRE-CHARGING AN AVERAGE FILTER ON A LOGARITHMIC DETECTOR

(75) Inventor: Laurent Gauthier, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 265 days.

(21) Appl. No.: 13/143,863

(22) PCT Filed: Feb. 23, 2009

(86) PCT No.: PCT/IB2009/052313
§ 371 (c)(1),
(2), (4) Date: Jul. 8, 2011

(87) PCT Pub. No.: WO2010/095009
PCT Pub. Date: Aug. 26, 2010

(65) Prior Publication Data
US 2011/0299638 A1    Dec. 8, 2011

(51) Int. Cl.
*H04L 27/06* (2006.01)
(52) U.S. Cl.
USPC .......... 375/340; 375/343; 375/316; 375/341; 455/250.1; 455/226.2; 455/245.1
(58) Field of Classification Search
USPC ............... 375/343, 340, 316, 341; 455/250.1, 455/226.2, 245.1
See application file for complete search history.

(56) References Cited

U.S. PATENT DOCUMENTS

| | | | | |
|---|---|---|---|---|
| 5,467,093 A | * | 11/1995 | Watson | 342/175 |
| 6,311,049 B1 | * | 10/2001 | Yoshizawa | 455/250.1 |
| 2002/0186797 A1 | * | 12/2002 | Robinson | 375/341 |
| 2005/0036568 A1 | | 2/2005 | De Ruijter et al. | |
| 2008/0278237 A1 | * | 11/2008 | Blin | 330/279 |

FOREIGN PATENT DOCUMENTS

| | | |
|---|---|---|
| EP | 1255408 A | 11/2002 |
| WO | 01/26260 A | 4/2001 |

OTHER PUBLICATIONS

International Search Report and Written Opinion correlating to PCT/IB2009/052313 dated Nov. 18, 2009.

* cited by examiner

*Primary Examiner* — Kenneth Lam

(57) ABSTRACT

The detector comprises a plurality of detection stages connected to a summator for providing a summation signal as a logarithmic representation of the input signal to a first input of a data slicer and an input of an average filter having an output connected to a second input of the data slicer. The data slicer has a data slicer output for providing an extracted digital data signal in dependence on a comparison of the summation signal and an output signal of the average filter. The average filter receives a first pre-charge voltage and a second pre-charge voltage depending on an output signal of a carrier detector circuit detecting a carrier signal of the input signal.

20 Claims, 10 Drawing Sheets

US 8,750,431 B2

LOGARITHMIC DETECTOR AND METHOD OF PRE-CHARGING AN AVERAGE FILTER ON A LOGARITHMIC DETECTOR

FIELD OF THE INVENTION

This invention in general relates to receivers and more specifically to a logarithmic detector for extracting a digital data signal from a received input signal.

BACKGROUND OF THE INVENTION

In radio frequency (RF) receivers, for example in low frequency (LF) receivers used e.g. for short range devices such as remote controls, or security systems, such as vehicle security systems, e.g. tyre pressure monitoring systems (TPMS), demodulation and baseband processing for extracting a digital data signal from a received input signal is usually done using analog circuits. The receiver comprises a detector circuit which has a baseband filter for providing a demodulated signal and a data slicer used to transform the demodulated analog signal to a digital one. This principle is illustrated in FIG. 1: An input signal is filtered using a baseband filter 12. A demodulated input signal is then applied to a data slicer 16, for example a comparator, and an average filter 18, that provides an average signal 20 to the data slicer. The data slicer compares the voltage of the signal 14 with a reference value which is for example the average value of the average signal 20 provided by the average filter.

Defining the averaging time constant of the average signal may be a compromise between speed and sensitivity, because fast averaging leads to high ripple in the average signal which reduces sensitivity, while slow averaging leads to low ripple thus improving sensitivity but at the expense of a longer delay until a valid extracted digital data signal 22 can be provided.

FIG. 2 shows a schematic diagram of a digital data signal extracted from a baseband input signal using a prior art approach of average filter pre-charging. The average filter is pre-charged once 32, e.g. at the level present at the input of the filter. An analog input signal 24 comprising noise 26 and an average signal 28 are compared for extracting a digital data signal 30. The average signal 28 slowly approximates a final average value of the input signal 24. Therefore, the data contained in the digital data signal may be corrupted due to the noise, and the duty cycle of the digital data signal 30 may not be correct due signal shaping of the input signal 24.

SUMMARY OF THE INVENTION

The present invention provides a logarithmic detector for extracting a digital data signal from a received input signal and a method of pre-charging an average filter of a logarithmic detector as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Identical reference numerals in different figures refer to identical or similar components.

DETAILED DESCRIPTION OF THE PREFERRED EMBODIMENTS

Figure 1:
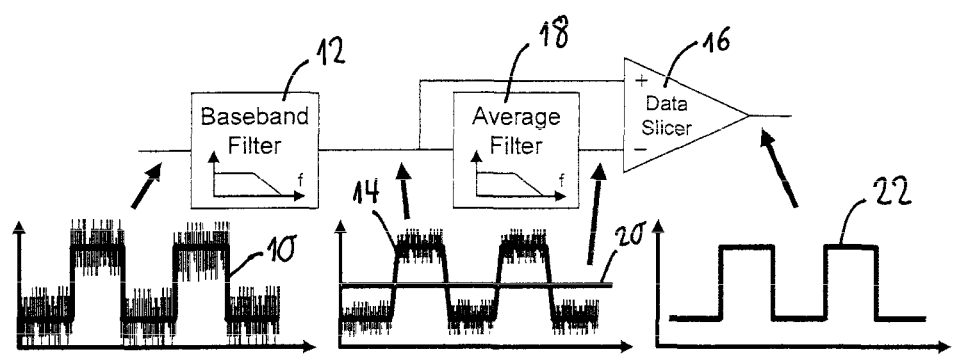
FIG. 1 schematically shows a principle of extracting a digital data signal from a received input signal.
Figure 2:
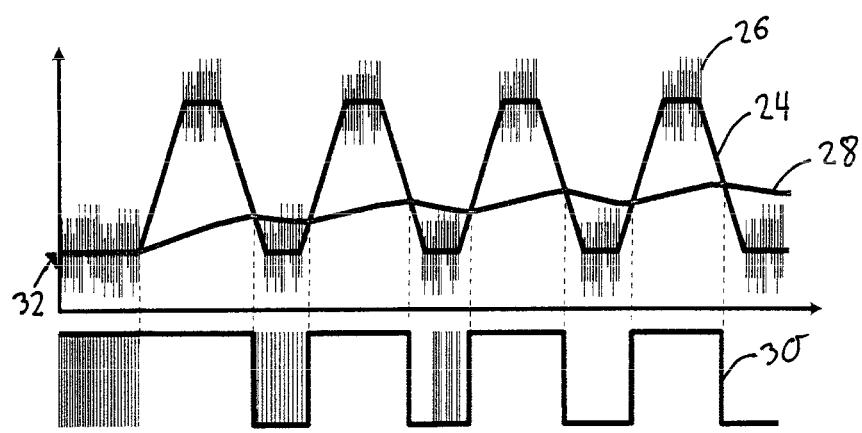
FIG. 2 shows a schematic diagram of a digital data signal extracted from an input signal using a prior art approach of average filter pre-charging.
Figure 3:
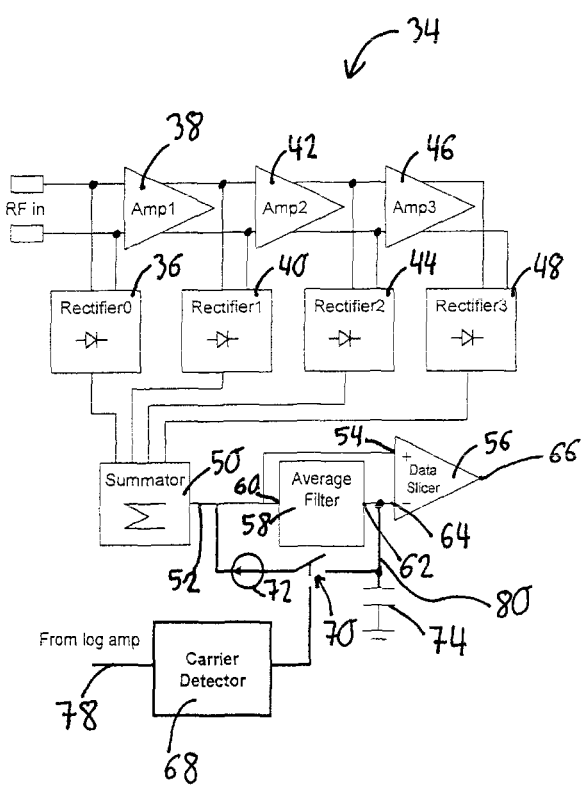
FIG. 3 shows a schematic block diagram of an example of a first embodiment of a logarithmic detector for extracting a digital data signal from a received input signal.

Referring to FIG. 3, a logarithmic detector 34 for extracting a digital data signal from a received input signal is illustrated. The detector 34 comprises a plurality of detection stages 36, 38, 40, 42, 44, 46, 48 connected to a summator 50 for providing a summation signal 52 as a logarithmic representation of the input signal to a first input 54 of a data slicer 56 and an input 60 of an average filter 58 having an output 62 connected to a second input 64 of the data slicer. The data slicer has a data slicer output 66 for providing an extracted digital data signal in dependence on a comparison of the summation signal and an output signal of the average filter. The average filter receives a first pre-charge voltage and a second pre-charge voltage depending on an output signal of a carrier detector circuit 68 detecting a carrier signal of the input signal.

For example, when processing input signals comprising high-density pulses of a digital signal with narrow pulse widths and large amplitude variations, a logarithmic detector may be used. The detection stages and summator may be used to condense a large input dynamic range into a smaller one through a logarithmic transfer function. As a result of this transfer function, a voltage swing of the summation signal 52 may be proportional to the input signal power range in dB.

The detection stages may comprise a plurality of rectifiers 36, 40, 44, 46 and amplifiers 38, 42, 46. The received input signal may be an RF signal, for example an LF signal. It may comprise a carrier signal and a modulation signal, for example an amplitude modulation. The modulation signal or modulation may be a representation of a digital data signal, for example when using amplitude shift keying (ASK).

The first pre-charge voltage may be a voltage level present at the input of the average filter after the carrier detector output signal first indicates a presence of the carrier signal. This may allow for a first or initial pre-charging once the detector is in a data detect mode and a carrier signal is detected. The detector may be used with analog as well as digital signal processing. When using this system for example with binary digital signals, the pre-charge value may therefore correspond to "1" or "0". Since decoding may be entered just after a carrier has been detected, there is a high probability that the carrier may still be present during this first pre-charge. This value or level may therefore indicate a presence of the signal. In the case the carrier may have been detected just before the level changes to "0", usually due to data modulation, the pre-charge may be done while the level is "0".

The second pre-charge voltage may define an output voltage of the average filter close to an average voltage of the summation signal 52 when the carrier detector output signal indicates a first rising edge of the input signal. The second pre-charge voltage may therefore pull an average level of an output signal of the average filter 58 close to the average voltage of the summation signal already with the first rising edge of the summation signal.

The pre-charge voltage values may be provided to the average filter using connection 80, a switch 70, and an offset voltage source 72. The switch may be controlled by the carrier detector 68 having an input 78 connected to one of the detector stages. The average filter may comprise a capacitor 74 connected to ground.

Figure 4:
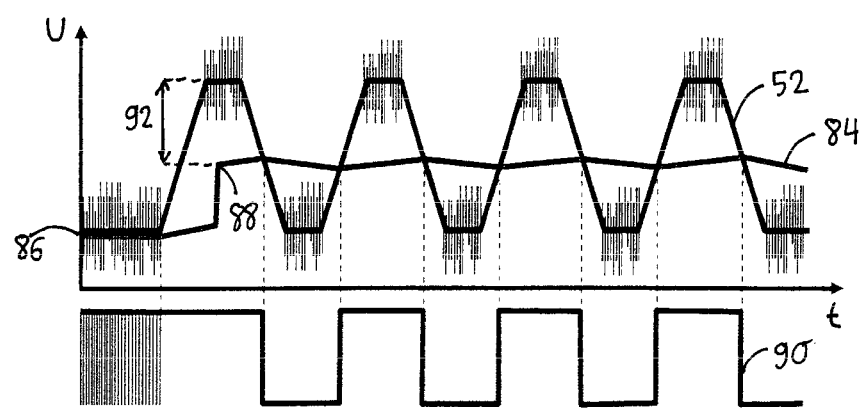
FIG. 4 shows a schematic diagram of a digital data signal extracted from an input signal using an approach of average filter pre-charging according to the logarithmic detector shown in FIG. 3.

Referring now also to FIG. 4, a schematic diagram of a digital data signal extracted from an input signal using an approach of average filter pre-charging according to the logarithmic detector shown in FIG. 3 is illustrated. The summation signal 52 and an average signal 84 receiving an initial first pre-charge 86 and a second pre-charge 88 after a first rising edge of the signal 52 has been detected are shown. A resulting extracted digital data signal 90 may need only one duty cycle before subsequent data may be valid.

Due to the logarithmic transfer function of the demodulation part, i.e. the detector stages with the summator, the shown summation signal 52 may have an essentially constant maximum output level due to a modulation depth lower than 100%. This applies when receiving an amplitude-shift-keying (ASK) encoded signal.

The second pre-charge voltage 88 may depend on a modulation depth of the input signal. It may be determined as a difference of a maximum of the summation signal 52 received since application of the first pre-charge and a constant offset that may be determined during design, depending on the modulation depth, i.e. a peak value of the modulation signal divided by an amplitude of the carrier signal. For example, the average filter may be charged to a value that works for a minimum modulation depth. Since the logarithmic detector may compress a delta between minimum and maximum values, this value may be suitable for any modulation depth.

Figure 5:
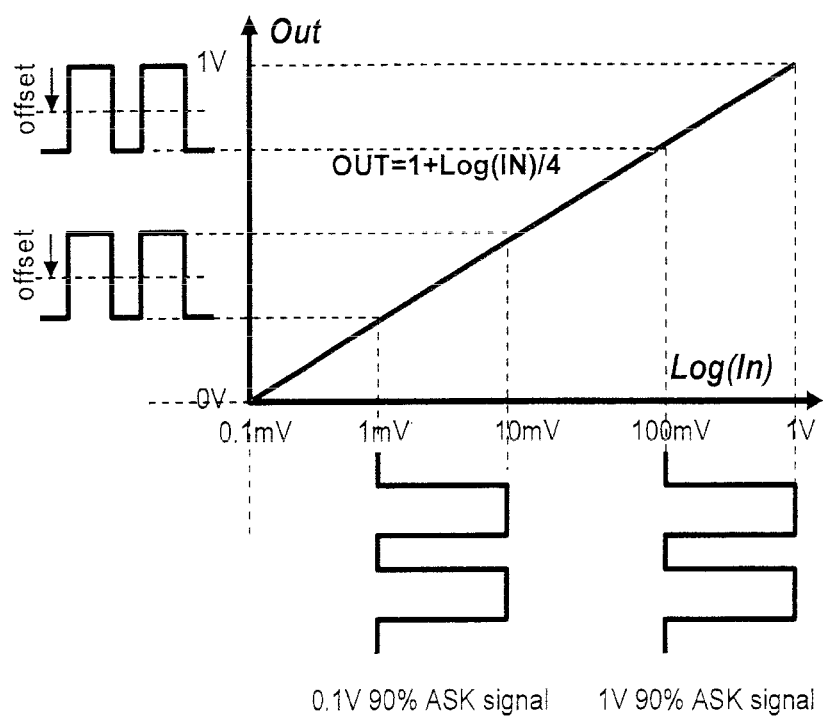
FIG. 5 shows a schematic diagram of an example of a transfer function for a logarithmic input signal to an output signal.

Referring to FIG. 5, a schematic diagram of an example of a transfer function for a logarithmic input signal to an output signal is shown. For optimum recovery of a data signal by the data slicer, the slicing level may be at half input level or an equivalent output offset. For this the offset may be determined for an optimum slicing level at the data slicer by half of the amplitude: offset=$-(\log(1-M))/8$; with M being the modulation depth. For example, a worst case modulation depth M=0.4 may give an offset=$(\log(1-0.4))/8=\log(0.6)/8$. This value, optimum for a worst case of M=0.4, may also be correct for higher modulation depth, allowing an optimum pre-charge for modulation depth 0.4 to 1.0.

This formula may be a result of the logarithmic representation of the summation signal. For example, a maximum input signal level V and a minimum input signal level V(1-M) may result in an input signal range of VM. A maximum of a demodulated signal, i.e. summation signal level according to the example logarithmic detector shown in FIG. 3, may be determined by $1+\log(V)/4$, a minimum level by $1+\log(V(1-M))/4$, giving a constant summation signal range of $-(\log(1-M))/4$.

Figure 6:
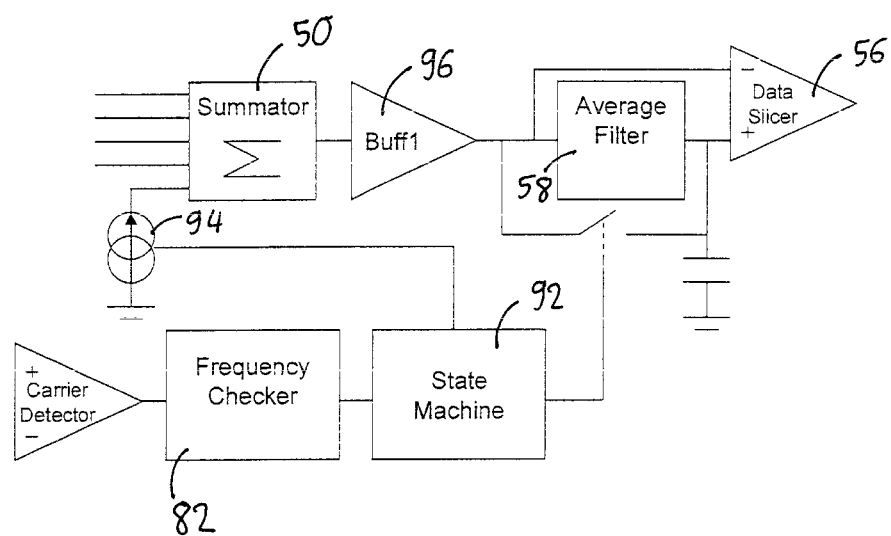
FIG. 6 shows a schematic block diagram of an example of a second embodiment of a logarithmic detector for extracting a digital data signal from a received input signal.

Referring now to FIG. 6, a schematic block diagram of an example of a second embodiment of a logarithmic detector for extracting a digital data signal from a received input signal is shown. Only elements different to the embodiment shown in FIG. 3 are explained in detail and the detector stages providing the input to the summator are not shown. The carrier detection circuit comprises a carrier detector connected to a frequency checker 82 connected to a state machine 92. The state machine may apply the first pre-charge to the average filter by closing switch 70 and the second pre-charge by applying an offset current provided by an offset current source. The summator 50 may be connected to an additional buffer 96. The frequency checker may for example count pulses of the input signal.

The second pre-charge may be applied to the average filter 58 delayed by a delay time after indication of said first rising edge. For example, a receiver, e.g. an LF receiver, comprising the logarithmic detector receiving pulses of an input signal may enter a data decode mode after a carrier has been detected. Once the receiver has been enabled, it may be possible to charge capacitors of the average filter 58 as soon as a sequence of 5 LF pulses has been detected. This 5 pulses sequence may help that the charging will be done on a valid LF signal and will help compensating a detector path delay, i.e. the delay caused by processing the input signal using the plurality of detection stages. However, the number of 5 pulses is only an example for illustration. The delay may be of any possible length. The delay time may depend on the detector path delay of said detection stages and may be chosen accordingly.

Figure 7:
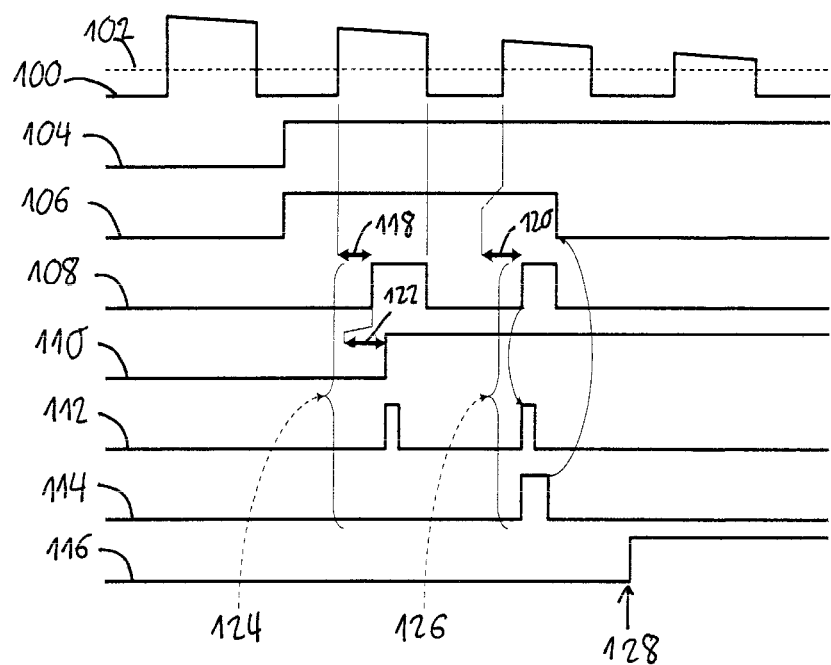
FIG. 7 shows a schematic example of a signal diagram according to an operation of a detector as shown in FIG. 6.

Referring now also to FIG. 7, a schematic example of a signal diagram according to an operation of a detector as shown in FIG. 6 is illustrated. An input LF signal 102 is illustrated. The carrier detector circuit may have a carrier detection threshold depending on an offset voltage. The threshold 102 of the carrier detector is shown. After switching from WAIT to ON cycle 104, a carrier detector enable signal 106 is set high, resulting in a carrier detect signal sensing the presence of a carrier and indicating it after a time delay 118, triggering a switching data decode mode 110 on after an additional delay 122, causing an average filter pre-charge 112 to apply 124 the first pre-charge to the average filter. Afterwards, when a rising edge is detected 126 and after an additional delay time 120, for example of 5 LF pulses, the second average filter pre-charge may be applied 126. Hence a complete pre-charge may be completed 128 before valid data is received. Therefore, a time-out may be generated to avoid a second pre-charge occur once demodulation of valid data begins.

Figure 8:
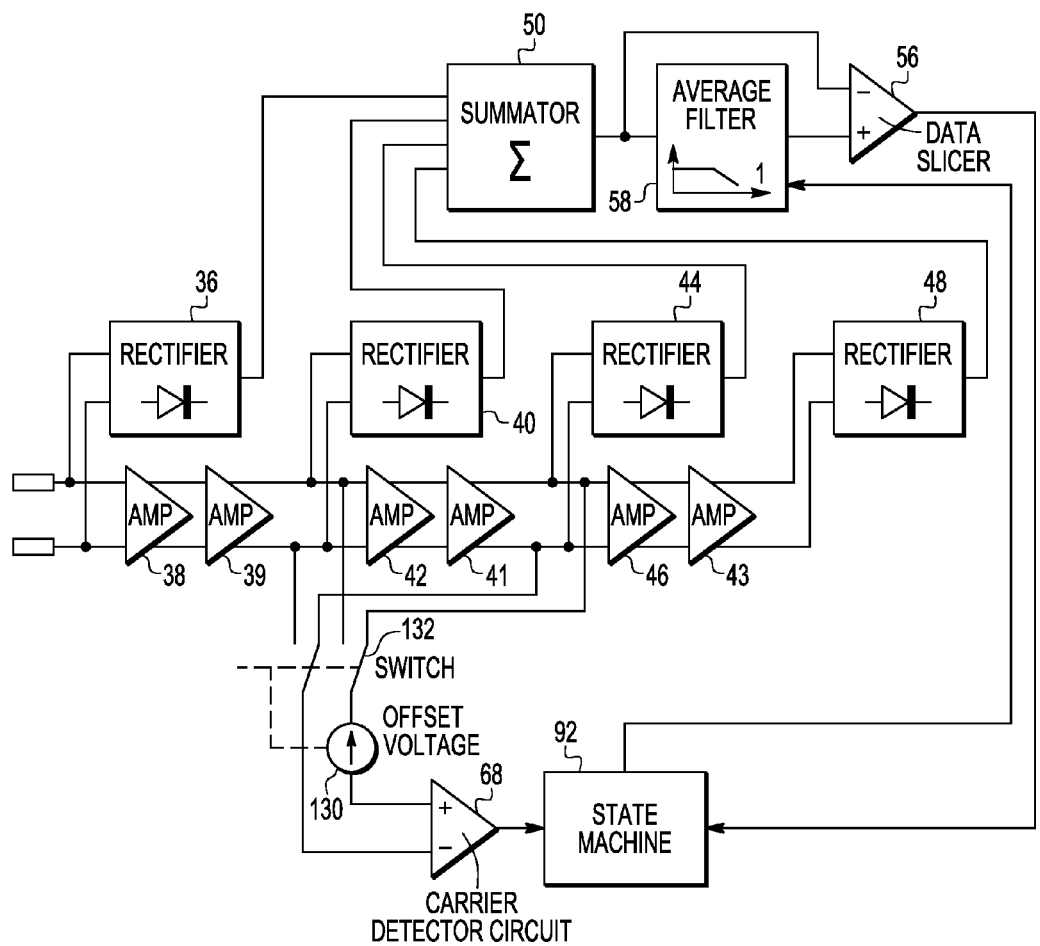
FIG. 8 shows a schematic block diagram of an example of a third embodiment of a logarithmic detector for extracting a digital data signal from a received input signal.

Referring now also to FIG. 8, a schematic block diagram of an example of a third embodiment of a logarithmic detector for extracting a digital data signal from a received input signal is shown. Only elements different to the embodiment shown in FIG. 3 are explained in detail. Each of the amplifiers shown in FIG. 3 is provided with a buffer 39, 41, 43. The carrier detector circuit may comprise a state machine according to the embodiment shown in FIG. 6. The detector and therefore a receiver comprising the detector circuit may have a programmable sensitivity. The sensitivity may be adjusted by changing an offset voltage 130 of the carrier detector. And the carrier detector circuit may comprise a switch 132 for connecting an input of the carrier detector circuit to one of the plurality of detection stages and therefore changing the amount of gain, which may enable changing the carrier detector threshold over a wide range.

Figure 9:
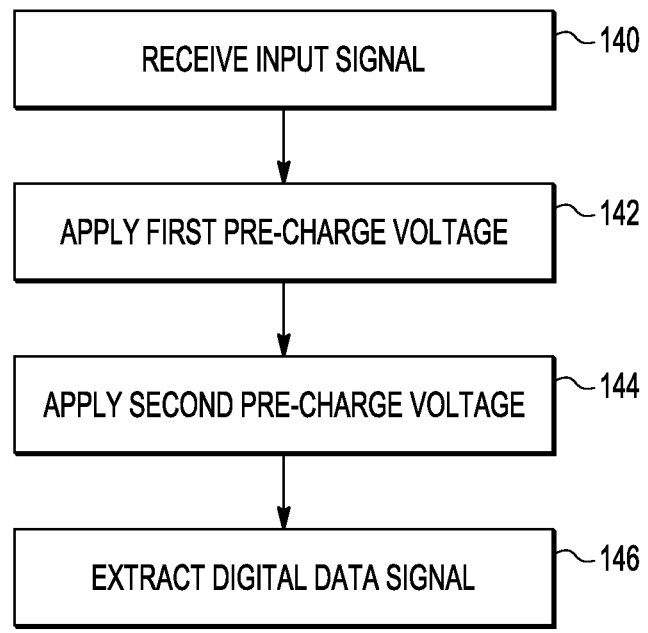
FIG. 9 shows a schematic flow diagram of an example of an embodiment of a method of pre-charging an average filter of a logarithmic detector.

Referring now to FIG. 9, a schematic flow diagram of an example of an embodiment of a method of pre-charging an average filter of a logarithmic detector is shown. The illustrated method allows implementing the advantages and characteristics of the described logarithmic detector as part of a method of pre-charging an average filter of a logarithmic detector. The method is applied to a detector comprising a plurality of detection stages connected to a summator for providing a summation signal as a logarithmic representation of the input signal. The method comprises receiving 140 an input signal; applying 142 a first pre-charge voltage to the average filter depending on an output signal of a carrier detector circuit; applying 144 a second pre-charge voltage to the average filter depending on the output signal of the carrier detector circuit; and extracting 146 a digital data signal from a comparison of the summation signal and an average filter output signal.

The method may comprise that the first pre-charge voltage may be a voltage level present at an input of the average filter after a presence of a carrier signal of the input signal is first indicated. For digital signalling, this level may still be high "1" or be low "0" after the carrier has disappeared due to modulation.

And the method may comprise that the second pre-charge voltage may define an output voltage of the average filter close to an average voltage of the summation signal when a first rising edge of the input signal is indicated.

Further, the method may comprise that the second pre-charge voltage may be applied to the average filter delayed by a delay time after indication of the first rising edge.

Figure 10:
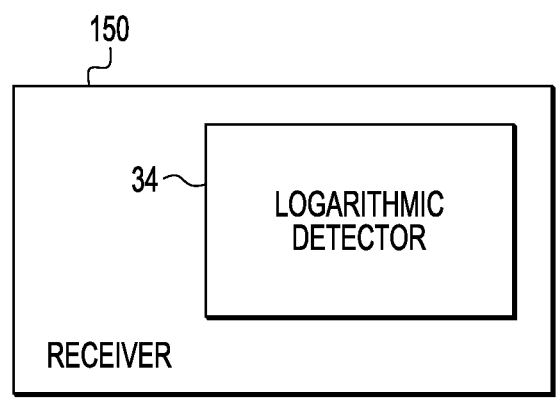
FIG. 10 shows a schematic diagram of a receiver comprising a logarithmic detector.

Referring now to FIG. 10, a schematic block diagram of a receiver 150 is shown, which may comprise a logarithmic detector or may execute a method as described before. A receiver may be an RF receiver, for example an LF receiver. However it may be any other radio receiver, such as a high-frequency (HF) receiver or an ultra high frequency (UHF) receiver. And a receiver may be part of a transmitter/receiver, i.e. a transceiver, e.g. an UHF transceiver. A receiver may be part of any device for digital communication using radio frequencies, for example a cordless telephone or a base station. It may be any device making use of standards like Bluetooth, ZigBee, or GSM (global system for mobile communication). However, it may be also be used in security applications, e.g. in vehicle security applications, such as tyre pressure monitoring systems (TPMS).

A computer program product may comprise code portions for executing steps of a method or for implementing parts of a logarithmic detector as described above when run on a programmable apparatus.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Also, at least portions of the architecture may be implemented using a programmable logic device (PLD), e.g. a field programmable gate array (FPGA), an application specific integrated circuit (ASIC) etc., or as a program code executable by a processing device, such as a digital signal processor (DSP), a microcontroller unit (MCU), a general purpose processor (GPP), a central processing unit (CPU), a graphics processing unit (GPU) etc.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of systems. For example, although FIG. 3 and the discussion thereof describe an exemplary logarithmic detector, this exemplary circuit is presented merely to provide a useful reference in discussing various aspects of the invention. Of course, the description of the circuit has been simplified for purposes of discussion, and it is just one of many different types of appropriate circuits that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures or circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of the capacitance sensing circuit are circuitry located on a single integrated circuit or within a same device. Alternatively, the logarithmic detector 34 may include any number of separate integrated circuits or separate devices interconnected with each other.

Also for example, logarithmic detector 34 or portions thereof may be soft or code representations of physical circuitry or of logical representations convertible into physical circuitry. As such, logarithmic detector 34 may be embodied in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. A logarithmic detector for extracting a digital data signal from a received input signal, comprising:
    a plurality of detection stages;
    a summator;
    a data slicer;
    an average filter;
    wherein said plurality of detection stages is connected to said summator for providing a summation signal as a logarithmic representation of said input signal to a first input of said data slicer and an input of said average filter, said average filter having an output connected to a second input of said data slicer;
    said data slicer having a data slicer output for providing an extracted digital data signal in dependence on a comparison of said summation signal and an output signal of said average filter;
    said average filter receiving a first pre-charge voltage and a second pre-charge voltage depending on an output signal of a carrier detector circuit detecting a carrier signal of said input signal, wherein said second pre-charge voltage depends on a modulation depth of said input signal.

2. The logarithmic detector as claimed in claim 1, wherein said first pre-charge voltage is a voltage level present at said input of said average filter after said carrier detector output signal first indicates a presence of said carrier signal.

3. The logarithmic detector as claimed in claim 2, wherein said second pre-charge voltage defines an output voltage of said average filter close to an average voltage of said summation signal when said carrier detector output signal indicates a first rising edge of said input signal.

4. The logarithmic detector as claimed in claim 1, wherein said second pre-charge voltage defines an output voltage of said average filter close to an average voltage of said summation signal when said carrier detector output signal indicates a first rising edge of said input signal.

5. The logarithmic detector as claimed in claim 4, wherein said second pre-charge is applied to said average filter delayed by a delay time after indication of said first rising edge.

6. The logarithmic detector as claimed in claim 5, wherein said delay time depends on a detector path delay of said detection stages.

7. The logarithmic detector as claimed in claim 1, wherein said summation signal has an essentially constant maximum output level.

8. The logarithmic detector as claimed in claim 1, wherein said carrier detector circuit has a carrier detection threshold depending on an offset voltage.

9. The logarithmic detector as claimed in claim 1, wherein said carrier detector circuit comprises a switch for connecting an input of said carrier detector circuit to one of said plurality of detection stages.

10. A method of pre-charging an average filter of a logarithmic detector, said detector comprising a plurality of detection stages connected to a summator for providing a summation signal as a logarithmic representation of an input signal, said method comprising
    receiving said input signal;
    applying a first pre-charge voltage to said average filter depending on an output signal of a carrier detector circuit;
    applying a second pre-charge voltage to said average filter depending on said output signal of said carrier detector circuit, wherein said second pre-charge voltage depends on a modulation depth of said input signal; and
    extracting a digital data signal from a comparison of said summation signal and an average filter output signal.

11. The method as claimed in claim 10, wherein said first pre-charge voltage is a voltage level present at an input of said average filter after a presence of a carrier signal of said input signal is first indicated.

12. The method as claimed in claim 11, wherein said second pre-charge voltage defines an output voltage of said average filter close to an average voltage of said summation signal when a first rising edge of said input signal is indicated.

13. The method as claimed in claim 10, wherein said second pre-charge voltage defines an output voltage of said average filter close to an average voltage of said summation signal when a first rising edge of said input signal is indicated.

14. The method as claimed in claim 13, wherein said second pre-charge voltage is applied to said average filter delayed by a delay time after indication of said first rising edge.

15. The method as claimed in claim 14, wherein said delay time depends on a detector path delay of said detection stages.

16. A receiver, comprising a logarithmic detector as claimed in claim 14.

17. A method of pre-charging an average filter of a logarithmic detector, said detector comprising a plurality of detection stages connected to a summator for providing a summation signal as a logarithmic representation of an input signal, said method comprising
    receiving said input signal;
    applying a first pre-charge voltage to said average filter depending on an output signal of a carrier detector circuit;
    applying a second pre-charge voltage to said average filter depending on said output signal of said carrier detector circuit, wherein said second pre-charge voltage defines an output voltage of said average filter close to an average voltage of said summation signal when a first rising edge of said input signal is indicated; and extracting a digital data signal from a comparison of said summation signal and an average filter output signal.

18. The method as claimed in claim 17, wherein said first pre-charge voltage is a voltage level present at an input of said average filter after a presence of a carrier signal of said input signal is first indicated.

19. The method as claimed in claim 17, wherein said second pre-charge voltage is applied to said average filter delayed by a delay time after indication of said first rising edge.

20. The method as claimed in claim 17, wherein said second pre-charge voltage depends on a modulation depth of said input signal.

* * * * *